United States Patent [19]

Raymond

[11] 4,391,846

[45] Jul. 5, 1983

[54] METHOD OF PREPARING HIGH-TEMPERATURE-STABLE THIN-FILM RESISTORS

[75] Inventor: Leonard S. Raymond, Tucson, Ariz.

[73] Assignee: The United States of America as represented by the United States Department of Energy, Washington, D.C.

[21] Appl. No.: 206,409

[22] Filed: Nov. 12, 1980

Related U.S. Application Data

[63] Continuation-in-part of Ser. No. 27,439, Apr. 5, 1979, abandoned.

[51] Int. Cl.³ .............................................. C23C 11/08
[52] U.S. Cl. ...................................... 427/99; 427/101; 427/255; 427/255.2; 252/518
[58] Field of Search ................. 427/101, 248, 99, 255, 427/255.2; 252/518; 338/308, 309

[56] References Cited

U.S. PATENT DOCUMENTS 3,540,920  11/1970  Wakefield ........................... 427/248
3,563,873  2/1971  Beyer ................................... 204/298

FOREIGN PATENT DOCUMENTS 45-13782  4/1970  Japan ................................... 338/308
481945  6/1975  U.S.S.R. ............................... 338/308

OTHER PUBLICATIONS

Vapor Deposition, Powell, 1966, pp. 322–325, 403, 596–597.

Primary Examiner—Sam Silverberg

[57] ABSTRACT

A chemical vapor deposition method for manufacturing tungsten-silicide thin-film resistors of predetermined bulk resistivity and temperature coefficient of resistance (TCR). Gaseous compounds of tungsten and silicon are decomposed on a hot substrate to deposit a thin-film of tungsten-silicide. The TCR of the film is determined by the crystallinity of the grain structure, which is controlled by the temperature of deposition and the tungsten to silicon ratio. The bulk resistivity is determined by the tungsten to silicon ratio. Manipulation of the fabrication parameters allows for sensitive control of the properties of the resistor.

9 Claims, 1 Drawing Figure

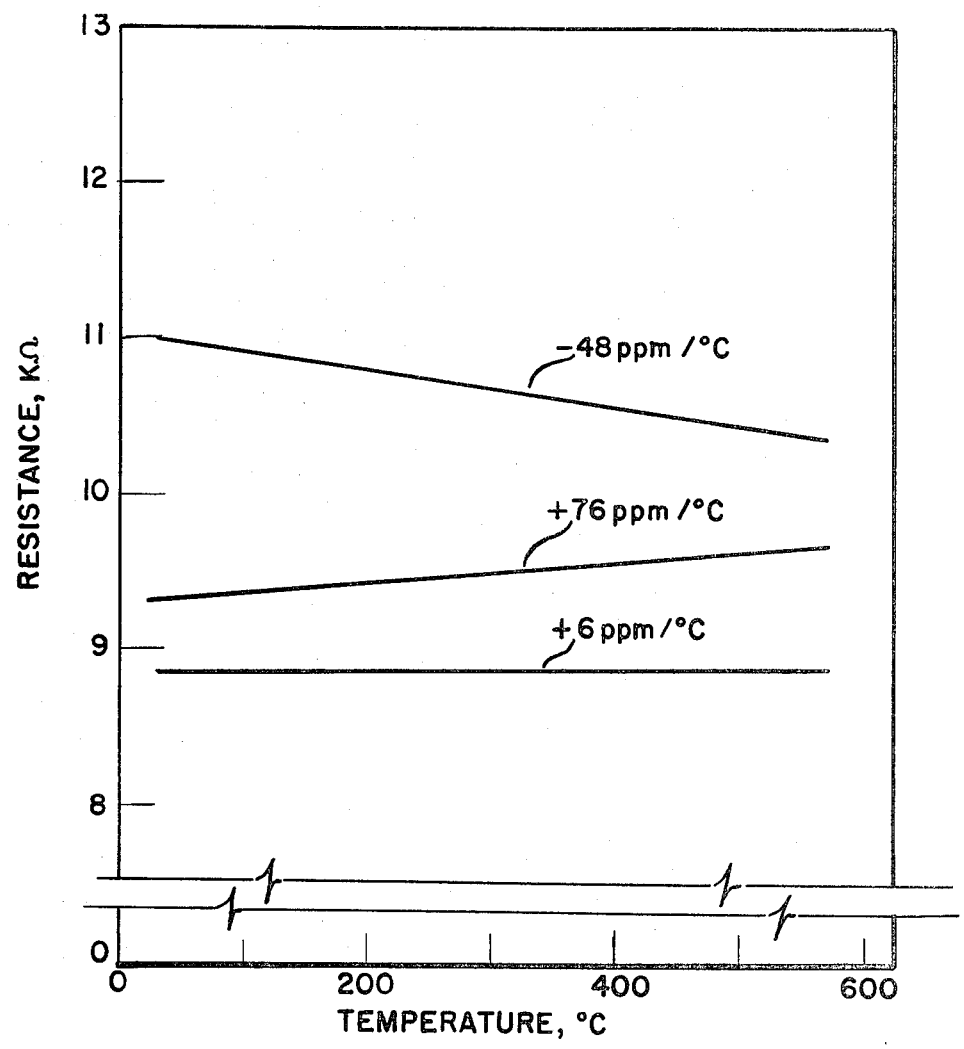

METHOD OF PREPARING HIGH-TEMPERATURE-STABLE THIN-FILM RESISTORS

CONTRACTUAL ORIGIN OF THE INVENTION

The U.S. Government has rights in this invention pursuant to Contract No. EY-76-S-02-4081 between the U.S. Department of Energy and University of Arizona.

This application is a continuation-in-part of U.S. patent application Ser. No. 27,439 filed Apr. 5, 1979, now abandoned.

BACKGROUND OF THE INVENTION

The instrumentation of geothermal wells requires development of electronic circuits for well-logging tools. Such circuits must be able to withstand environmental conditions generally much more severe than are encountered by conventional or military electronics. Components suitable for utilization in the instrumentation of geothermal wells are required to maintain their stability at temperatures up to about 500° C. Instrumentation for other high-temperature applications, such as nuclear reactors, also requires high-temperature stable components.

Useful electronic circuits require a combination of both passive components and active devices. This means that passive components, such as resistors, which meet the high-temperature stability requirements, must also be compatible with active components both in fabrication processing and in circuit performance. Thus what is needed is a thin-film technology which is compatible with the processing methods used in fabricating either semiconductors or integrated thermionic devices and will produce passive components which are electrically compatible with these active devices.

Resistors for use in such circuits must have a well characterized resistivity and temperature coefficient of resistance, hereinafter referred to as TCR. The TCR is a measure of the change in resistance with respect to the change in operating temperature of the resistor and is commonly expressed in units of ppm/°C. A resistor with a positive, negative or zero TCR may be required depending on the type of circuit and its particular applications. Moreover, the bulk and sheet resistivities of these components should be as independent of the TCR as possible. Thus, the method of fabricating thin-film resistors in addition to the requirements mentioned above, must be able to produce resistors of preselected resistivity and TCR.

Present processes for preparing thin-film resistors include the plating of nickel-chromium on a substrate by the thermal evaporation of nickel-chromium compounds in a vacuum or by the ion-bombardment of a nickel-chromium target. While thin films of nickel-chromium and also tantalum have found acceptance, they are not capable of withstanding temperatures greater than about 125° C. and thus are unsuitable for applications which require high-temperature stability.

U.S. Pat. No. 3,563,873 to D. S. Beyer describes a method for producing thin-film tungsten-silicon resistors suitable for high-temperature applications by sputter deposition from a tungsten-silicon target onto a silicon substrate. The sputter deposition method does not provide for strict control of the resistivity of the final product because the resistivity depends on the elemental composition of the deposited material and that composition can not be predicted from the composition of the ion-bombarded target. Furthermore, there is no control over the temperature coefficient of resistance (TCR) of the sputtered material which is necessary for full integration of electronic functions. In order to change the composition of a sputtered film a target of a different composition must be used. The high cost of these targets restricts the range of tungsten to silicon ratios of the final resistors. U.S. Pat. No. 3,540,920 to G. F. Wakefield describes a method of producing oxidation-resistant coatings by vapor deposition of silicon and tungsten onto metal alloy substrates. This invention, because it is directed to the non-analogous art of coatings rather than thin-film resistors, does not disclose a method of fabricating resistors of predetermined resistivity and TCR which are compatible with other electronic components for use under high temperature conditions.

SUMMARY OF THE INVENTION

A method has been developed for fabricating high-temperature stable thin-film resistors of a preselected resistivity and TCR. The method of the instant invention, involving the chemical vapor deposition of tungsten and silicon from a reactant gas mixture of gaseous tungsten and silicon compounds onto a heated substrate, comprises controlling the ratio of tungsten to silicon in the reactant gas flow to control the ratio of tungsten to silicon in the deposited thin film whereby the TCR becomes increasingly positive as the proportion of tungsten increases and increasingly negative as the proportion of silicon increases and the bulk resistivity increases and decreases directly with the proportion of silicon, and controlling the temperature of the substrate during deposition whereby the TCR becomes increasingly positive at higher deposition temperature and approaches 0 ppm/°C. at lower deposition temperature.

The method of the subject invention has significant advantages over other methods of fabricating thin-film resistors. Thin-film resistors can be made over a wide range of bulk resistivity and TCR values by simply adjusting the fabrication parameters. Small changes in tungsten to silicon ratio, substrate temperature, gas flow rate, deposition time, or any other fabrication parameter gives sensitive control of the properties of the thin-film resistors. Thus, different resistors can be made for a variety of applications without major changes in the fabrication apparatus. Interconnecting metalization between components can be easily deposited by this method by changing the reactant gas to a tungsten compound instead of a mixture of silicon and tungsten compounds. Similarly, passivation films can be deposited by changing the reactant gas to one which will deposit silicon nitride or silicon dioxide. Still another advantage is that annealing of the resistors is not necessary because of the stability of the films as deposited.

The process of this invention employs methods similar to those used for manufacturing semiconductor integrated circuits, and the resulting resistors are compatible with integrated circuits in material properties, area requirements, and electrical performance.

It is therefore one object of the invention to provide a method for preparing thin-film resistors in which the bulk resistivity of the thin film is controllable and reproducible.

It is another object of the invention to provide a method for preparing high-temperature stable thin-film resistors in which the temperature coefficient of resistance of the film can be controlled.

It is another object of the invention to provide a method for preparing thin-film resistors which are capable of withstanding temperatures up to at least 500° C.

Finally, it is the object of the invention to provide a method for preparing thin-film resistors which is compatible with present methods for preparing microelectronic circuits.

BRIEF DESCRIPTION OF THE FIGURE

The FIGURE is a graph showing the resistance-temperature relationship of three different tungsten-silicon resistors.

DESCRIPTION OF THE PREFERRED EMBODIMENT

In the method of making tungsten silicide thin-films, these and other objects of the invention may be met by controlling the ratio of silicon to tungsten whereby within the range of 3:1 to 1:3 the bulk resistivity varies proportionally with the concentration of silicon while the TCR remains essentially zero, and beyond this range the TCR becomes increasingly positive as the proportion of tungsten increases and increasingly negative as the proportion of silicon increases; and by controlling the deposition temperatures of the substrate between 500° C. and 900° C. whereby a higher deposition temperature causes the tungsten and silicon to deposit in a more crystalline grain structure which results in a more positive TCR and a lower substrate temperature causes silicon and tungsten to deposit in a more amorphous grain structure which results in a more negative TCR.

The method of the instant invention is more easily understood in terms of the free electron model of metals. In this model, the conductance of electronic circuit components is determined by the number of conduction electrons in the material and the mean free path of these conduction electrons within the lattice of the material. Thus, a material with few conduction electrons and a short mean free path for each conduction electron will have a high electical resistance. The number of conduction electrons is an intinsic property of the particular material. The length of the mean free path is influenced by the lattice vibrations of the material such that large lattice vibrations shorten the mean free path of the conduction electrons.

Semiconductor materials have relatively few conduction electrons. Silicon, for example, has on the order of $10^-$ conduction electrons/cm$^3$. As silicon is heated many more conduction electrons are released, lowering the resistance. This decrease in resistance with an increase in temperature corresponds to a negative TCR. Silicon is an inherent glass-former, which means that it tends to form an amorphous grain structure with a short mean free path. Simultaneously, the higher temperature induces greater lattice vibrations which tend to reduce the mean free path of the conduction electrons even further and increase the resistance to produce a positive TCR. In the case of semiconductors, the vibration effect is much smaller than the effect of the increase in the number of conduction electrons, and a negative TCR results.

Metals generally have many more conduction electrons than semiconductors. Tungsten has on the order of $5 \times 10^{22}$ electrons/cm$^3$ which is close to the maximum number possible for any material. When tungsten is heated only a few additional conduction electrons are released. In this case the effect of the increased lattice vibrations in shortening the mean free path of the conduction electrons and raising the resistance of the components is large enough to compensate for the small decrease in resistance caused by the few additional thermally released electrons. The resulting increase in resistance with temperature corresponds to a positive TCR.

Previously, thin-film resistors were made of a ceremet (a ceramic-metal mixture) which is usually highly crystalline in structure. The regularly ordered lattice of the crystalline structure magnifies the effects of the lattice vibrations and changes in the number of conduction electrons. In this type of material, a 0 ppm/°C. TCR was approached by controlling the amounts of semiconductor and metal to balance the the two effects just described.

In the method of the subject invention, the need to balance these two effects is obviated by depositing the tungsten and silicon so that an amorphous grain structure is formed. Conduction electrons moving within the disordered lattice can travel on the average the length of only one atom before colliding with another atom and being deflected. In other words, the mean free path is minimized. A lattice of this nature can still vibrate when heated but it is already so disordered that vibrations produce very little change in the mean free path of the conduction electrons. As the operating temperature is increased, there is little or no change in the resistance of the material and a 0 ppm/°C. TCR is approached. Thus, the subject invention achieves the desired result of 0 ppm/°C. TCR by means of an amorphous lattice structure instead of by balancing the effects of semiconductors and metals. This effect holds until the operating temperature becomes so great that a significant number of the conduction electrons are produced thermally or until the proportion of either tungsten or silicon in the resistor becomes so great that the properties of the resistor approach those of the predominant element.

Thus, when the ratio of tungsten to silicon is maintained beween 3:1 and 1:3 and the structure is amorphous, increasing the operating temperature wil neither raise nor lower the resistivity because the mean free path has been minimized and a near 0 ppm/°C. TCR will be achieved. The desired resistivity of the material can be attained by controlling the tungsten to silicon ratio within this range so that at a ratio of 3:1 the resistivity is on the order of $100 \times 10^{-6} \Omega$ cm and the TCR is about $+200$ ppm/°C., and at a ratio of 1:3 the resistivity is on the order of $0.5 \Omega$ cm and the TCR is about $-200$ ppm/°C. As the ratio becomes higher and the resistor becomes more like pure tungsten the resistivity approaches a limit of about $7.5 \times 10^{-6} \Omega$ cm and the TCR approaches $+3000$ ppm/°C. As the ratio becomes much lower and the resistor is more like pure silicon the resistivity approaches an upper limit of about $10^6 \Omega$ cm and the TCR approaches $-4000$ ppm/°C.

The amorphous lattice structure of the subject invention is achieved by controlling the temperature of the substrate during vapor deposition. At low substrate temperatures the deposited atoms of tungsten and silicon remain in the random configuration in which they originally strike the substrate, resulting in an amorphous structure. At higher substrate temperatures, the deposited atoms receive sufficient energy from the hot substrate to rearrange into an ordered crystal structure. It can be seen that simultaneous control of the deposition temperature and the tungsten to silicon ratio enables the preselection of almost any combination of resistivity and TCR desired.

Specifically, resistors are made according to the method of the subject invention by placing a substrate of an oxidized silicon wafer in a reactor, flowing a reducing carrier gas at a pressure of from about 0.1 to about 10 torr through the reactor to displace the ambient gas, heating the substrate to a reaction temperature of from about 500° to 900° C., and introducing a reactant gas containing at least one decomposable tungsten compound such as tungsten hexafluoride and at least one decomposable silicon compound such as silane into the carrier gas, the ratio of tungsten hexafluoride to silane varying from almost all tungsten compound to almost all silicon compound, whereby the reactant gas contacts the surface of the hot substrate and decomposes to form a thin film of tungsten silicide on the substrate, thus forming a thin-film resistor. The proportion of tungsten to silicon and the temperature of deposition will determine the degree of crystallinity of the thin film.

The substrate upon which the thin films are deposited serves only as a mechanical support. The substrate must be inert to the deposited materials and to the high-temperature deposition conditions. The surface of the substrate should be an electrically insulative surface such as silicon dioxide and is preferably polished since scratches and surface deviations could lead to component instability and failure. Suitable substrate materials in addition to oxidized silicon include sapphire, quartz and passivated molybdenum.

The reducing carrier gas may be any suitable inert gas such as helium or argon to which sufficient hdyrogen has been added to make the gas reducing such as, for example, a ratio of at least 1 part hydrogen to 10 parts inert gas. Alternatively, the carrier gas may consist of hydrogen alone. The carrier gas serves to remove the ambient gases which would otherwise contaminate the thin films, to provide a reducing environment for the reaction and as a carrier and diluent for the reactant gases. The flow rate of carrier gas will depend upon the particular chemical vapor deposition system being used and must be adequate to ensure an even deposition of W-Si on the substrate. For a 4" diameter reactor, a flow rate of 1 to 2 liters per minute was found satisfactory.

The temperature to which the substrate is heated must be sufficient to decompose the reactant gases and form the W-Si film on the surface. Thus, the temperature must be at least 500° C. to promote decomposition while 600° C. is preferred to ensure an adequate deposition rate. Deposition may occur at temperatures as high as 900° C. and still be consistent with the instant invention.

The pressure in the reactor may vary from about 0.1 to about 700 torr, although a pressure range from about 0.1 to about 10 torr has proven satisfactory.

The reactant gases may be any of the gaseous compounds of tungsten and silicon which are thermally decomposable in a reducing atmosphere to form metallic tungsten and silicon. Although tungsten hexafluoride and silane have been found to provide good results, other gases such as tungsten pentachloride, tungsten organo-metallic compounds, silicon tetrachloride and dichlorosilane will also be satisfactory. The ratio of these gaseous compounds in the reactant gas may vary from almost all gaseous tungsten compounds to almost all gaseous silicon compounds, depending upon the tungsten-silicon composition desired. Thus for a gas ratio of 1:1, a bulk resistivity of about 2500 uohm cm was attained with about a 0 ppm/°C. TCR. The ratio of the carrier gas to the reactant gas generally will vary from 100:1 to 1000:1. For a 4" diameter reactor a flow rate of about 2-6 cc per minute of reactant gas in a carrier gas flow rate of 1-2 liters per minute is satisfactory.

Deposition times depend upon the rate of deposition, upon the bulk resistivity of the film which is being deposited and upon the desired sheet resistivity. Thus deposition times may vary from about 3 to about 12 minutes. Film thickness may range from 0.01 $\mu$m to >1.0 $\mu$m, while typically, film thickness is about 0.025 $\mu$m and typically sheet resistivity is 400 to 1000 ohms/square.

The method of the invention may be practiced in any suitable chemical vapor deposition apparatus such as a vertical or horizontal reactor which may be either cold wall or hot wall heated.

Resistor patterns can be delineated in the film by standard photolithographic methods incorporating chemical etching.

It can be seen that there are many interrelated variables such as gas pressure, gas flow rate, reactant gas ratio and flow rate and reaction temperature and time which have an effect upon the bulk resistivity and the TCR of the thin-film resistor, which cannot be set forth with particularity here, but which, with the information which has been given, can readily be determined with a minimum amount of experimentation by those skilled in the art in order to obtain thin films which exhibit the desired high-temperature resistivity and temperature coefficient of resistance characteristics.

EXAMPLE I

A chemical vapor deposition apparatus was used which consisted of a quartz reaction tube 4" in diameter surrounded by a RF coil and containing a graphite susceptor 2½"×6" which permitted processing of two 2" diameter substrates at a time. The temperature range of the reactor was 400° to greater than 1200° C.

The pressure in the reactor was reduced to about 5.5 torr and hydrogen as a carrier gas was flowed through the reactor at a rate of 1-2 liters per minute until all the atmospheric gases were displaced. The susceptor was heated to 750° to 780° C. and $WF_6$ and $SiH_4$ in a ratio of 1:1 were introduced into the carrier gas at a total rate of 6 cc per minute. After a deposition time of 6 minutes, the flow was stopped and the reactor cooled. The deposition rate of the material varied slightly, but was in the 0.01 $\mu$m/min range.

The tungsten-silicon composition of the film was not entirely uniform, varying from tungsten-rich at the front to silicon-rich at the rear. The film was delineated into several resistor test patterns having surface dimensions 2×120 mils. The TCR was less than 100 ppm/°C. for all the film grown under these conditions. Resistance versus temperature tests were made on the resistors and the results are given in the figure. It should be noted that neither hysteresis effects nor voltage coefficient of resistance were observed as the temperature was cycled.

EXAMPLE II

An additional series of films were deposited on silicon wafers under conditions as in Example I except that the pressure was 5.2 torr, the carrier gas was hydrogen and helium in a ratio of 1:1 and the temperature varied from 700° to 900° C. Following deposition of the resistive material, the wafers were measured with a four-point probe and processed into resistors. It was found that there was a concentration gradient across the wafers in the reactor with the rear wafer having a higher concentration of silicon. Thus the resistivities on the rearmost wafers were higher and the TCR's lower than on the front wafers.

The TCR's for this series of runs varied from +268 ppm/°C. to +72 ppm/°C. except for wafers run at 900° C. It should be noted that all the Resistance vs Temperature curves for all the resistors were straight lines and have constant TCR's over the entire measurement range of 25° C. to 550° C. Material with a very high silicon content had a resulting Resistance vs Temperature curve that was logarithmic. The sheet resistance at room temperature was on the order of $10^8$ ohm/square.

As can be seen from the preceding discussion and examples, the method of the invention provides an effective method for preparing composite high-temperature-stable thin-film resistors in which the bulk resistivity of the film is controllable and reproducible and whose temperature coefficient of resistivity can be controlled.

The embodiments of the invention in which an exclusive property or privilege is claimed are defined as follows:

1. A chemical vapor deposition method for the preparation of high temperature stable thin film resistors having a predetermined temperature coefficient of resistance (TCR) and bulk resistivity comprising:
   placing a substrate having an electrically insulative surface in a reactor;
   flowing a reducing carrier gas through the reactor at a pressure of about 0.1 to 10 Torr to remove the ambient gas;
   heating the substrate to a controlled temperature between 500° C. and 900° C.;
   introducing a reactant gas into the flowing carrier gas, the reactant gas comprising a mixture of at least one decomposable compound of tungsten and at least one decomposable compound of silicon in a controlled ratio; and
   contacting the flowing reactor and carrier gases with the heated surface of the substrate to decompose the reactant gas to deposit a thin film of tungsten silicide on the substrate, the controlled ratio of tungsten to silicon in the reactant gas being in part determinative of the tungsten to silicon ratio in the thin film which is determinative of the bulk resistivity and TCR of the film, and the controlled temperature of the substrate being determinative of the crystallinity of the film which is determinative of the TCR of the film, whereby for a tungsten to silicon ratio in the range of 1:3 to 3:1 a low substrate temperature will produce an essentially amorphous film having a TCR nearly equal to 0 ppm/°C. and increasing the substrate temperature will produce a more crystalline film having a more positive TCR, and whereby for tungsten to silicon ratios outside the limits of 1:3 to 3:1 the tungsten to silicon ratio will also affect the value of the TCR.

2. The method of claim 1 wherein the ratio of tungsten to silicon in the thin film is controlled within the range of 3:1 to 1:3 whereby as the ratio approaches 3:1 the bulk resistivity approaches about $100 \times 10^{-6}\Omega$ cm and the TCR approaches about +200 ppm/°C., and as the ratio approaches 1:3 the bulk resistivity approaches about $0.5\Omega$ cm and the TCR approaches about −200 ppm/°C.

3. The method of claim 1 wherein the ratio of tungsten to silicon in the thin film is maintained above 3:1 whereby as the ratio increases the bulk resistivity will approach a lower limit of about $7.5 \times 10^{-6}\Omega$ cm and the TCR will approach a positive limit of about +3000 ppm/°C.

4. The method of claim 1 wherein the ratio of tungsten to silicon in the thin film is maintained below 1:3 whereby as the ratio decreases the bulk resistivty will exponentially approach an upper limit of about $10^6\Omega$ cm and the TCR will approach a negative limit of about −4000 ppm/°C.

5. The method of claim 2 wherein tungsten to silicon ratio is about 1:1 and the deposition temperature is between 600° C. and 800° C. whereby the TCR of the thin film is about 0 ppm/°C.

6. The method of claim 1 wherein the decomposable gaseous compounds of tungsten are selected from the group consisting of tungsten hexafluoride and tungsten pentachloride and the decomposable compounds of silicon are selected from the group consisting of silane, silicon tetrachloride, and dichlorosilane.

7. The method of claim 6 wherein the substrate is selected from the group consisting of silicon, sapphire, quartz and passivated molybdenum.

8. The method of claim 7 wherein the reducing carrier gas is selected from the group consisting of helium containing at least 10% hydrogen, argon containing at least 10% hydrogen, and hydrogen, and the ratio of carrier gas to reactant gas is from 100:1 to 1000:1.

9. The method of claim 8 wherein the deposition time is from about 3 to about 12 minutes.

* * * * *